United States Patent
Udrea et al.

(10) Patent No.: US 7,605,446 B2
(45) Date of Patent: Oct. 20, 2009

(54) BIPOLAR HIGH VOLTAGE/POWER SEMICONDUCTOR DEVICE HAVING FIRST AND SECOND INSULATED GATED AND METHOD OF OPERATION

(75) Inventors: Florin Udrea, Cambridge (GB); Nishad Udugampola, Cambridge (GB); Gehan A. J. Amaratunga, Cambridge (GB)

(73) Assignee: Cambridge Semiconductor Limited, Cambridge (GB)

( * ) Notice: Subject to any disclaimer, the term of this patent is extended or adjusted under 35 U.S.C. 154(b) by 185 days.

(21) Appl. No.: 11/486,377

(22) Filed: Jul. 14, 2006

(65) Prior Publication Data

US 2008/0012043 A1  Jan. 17, 2008

(51) Int. Cl.
H01L 27/082 (2006.01)
H01L 27/102 (2006.01)
H01L 29/70 (2006.01)
H01L 31/11 (2006.01)
H01L 29/76 (2006.01)
H01L 29/94 (2006.01)
H01L 31/062 (2006.01)
H01L 31/113 (2006.01)
H01L 31/119 (2006.01)
H01L 23/58 (2006.01)

(52) U.S. Cl. ............... 257/565; 257/341; 257/401; 257/409; 257/488; 257/489; 257/490; 257/578; 257/E27.053; 257/E27.074; 257/E27.106; 257/E27.149; 257/E29.174

(58) Field of Classification Search ......... 257/341, 257/401, 409, 488–490, 578, 565, E27.053, 257/E27.074, E27.106, E27.149, E29.174
See application file for complete search history.

(56) References Cited

U.S. PATENT DOCUMENTS

| | | | | |
|---|---|---|---|---|
| 5,023,678 A | * | 6/1991 | Kinzer | 257/339 |
| 5,293,054 A | * | 3/1994 | Shekar et al. | 257/152 |
| 5,362,980 A | * | 11/1994 | Gough | 257/355 |
| 5,396,087 A | * | 3/1995 | Baliga | 257/139 |
| 5,411,901 A | * | 5/1995 | Grabowski et al. | 438/283 |
| 5,548,133 A | * | 8/1996 | Kinzer | 257/155 |
| 5,559,348 A | * | 9/1996 | Watabe et al. | 257/141 |
| 5,744,830 A | | 4/1998 | Ekkanath-Madathil | 257/140 |
| 5,828,101 A | * | 10/1998 | Endo | 257/330 |
| 5,925,900 A | * | 7/1999 | Amaratunga et al. | 257/147 |
| 5,969,378 A | * | 10/1999 | Singh | 257/77 |

(Continued)

FOREIGN PATENT DOCUMENTS

GB  2 295 052  5/1996

OTHER PUBLICATIONS

Florin Udrea, "The MOS Inversion Layer as a Minority Carrier Injector," *IEEE Electron Device Letters*, vol. 17, No. 9, Sep. 1996, pp. 425-427.

(Continued)

*Primary Examiner*—Ida M Soward
(74) *Attorney, Agent, or Firm*—Pillsbury Winthrop Shaw Pittman, LLP

(57) ABSTRACT

A bipolar high voltage/power semiconductor device has a drift region having adjacent its ends regions of different conductivity types respectively. High and low voltage terminals are provided. A first insulated gate terminal and a second insulated gate terminal are also provided. One or more drive circuits provide appropriate voltages to the first and second insulated gate terminals so as to allow current conduction in a first direction or in a second direction that is opposite the first direction.

19 Claims, 10 Drawing Sheets

U.S. PATENT DOCUMENTS

| | | | | |
|---|---|---|---|---|
| 5,977,569 | A | * | 11/1999 | Li ............................ 257/119 |
| 6,144,070 | A | * | 11/2000 | Devore et al. .............. 257/343 |
| 6,528,849 | B1 | * | 3/2003 | Khemka et al. ............ 257/342 |
| 7,470,960 | B1 | * | 12/2008 | Sugawara .................. 257/401 |
| 2002/0043699 | A1 | * | 4/2002 | Akiyama .................... 257/575 |

OTHER PUBLICATIONS

Udugampola et al., Dual Gate Lateral Inversion Layer Emitter Transistor for Power and High Voltage Integrated Circuits, 4 pages.

Florin Udrea, Experimental Demonstration of an Ultra-Fast Double Gate Inversion Layer Emitter Transistor (DG-ILET), *IEEE Electron Device Letters*, vol. 23, No. 12, Dec. 2002, pp. 725-727.

Takahashi et al., "1200V Reverse Conducting IGBT," Proceedings of 2004 International Symposium on Power Semiconductor Devices & ICs, pp. 133-136.

* cited by examiner

BIPOLAR HIGH VOLTAGE/POWER SEMICONDUCTOR DEVICE HAVING FIRST AND SECOND INSULATED GATED AND METHOD OF OPERATION

FIELD OF THE INVENTION

The present invention relates to a semiconductor device and to a method of operating a semiconductor device.

The present invention is particularly concerned with high voltage semiconductor devices which can be used in power integrated circuits and has particular application to MOS-bipolar transistors, such as lateral insulated gate bipolar transistors (LIGBTs).

BACKGROUND OF THE INVENTION

Power devices operated in integrated circuits typically operate with a voltage in the range 20V to 1.2 kV and typically higher than 30V or 50V or so. Power devices typically operate with a current in the range 10 mA to 50A and typically higher than 0.1A and smaller than 5 A. Such devices may also be referred to as "high voltage/power devices". These devices are typically capable of delivering from a few mWatts to 1 Watt or even a few tens of Watts of power. Their application may range from domestic appliances, electric cars, motor control, and power supplies to RF and microwave circuits and telecommunication systems.

It will be appreciated that the terms "top" and "bottom", "above" and "below", and "lateral" and "vertical", may be used in this specification by convention and that no particular physical orientation of the device as a whole is implied.

Lateral devices in integrated circuits have the main terminals (variously called the anode/cathode, drain/source and emitter/collector) and the control terminals (termed the gate or base) placed at the top surface of the device in order to be easily accessible. In power ICs, such devices are often monolithically integrated with CMOS-type or BiCMOS-type low voltage/low power circuits. It is desirable that several high voltage/power devices are integrated within the same chip.

MOS bipolar power devices, such as the lateral insulated gate bipolar transistor (LIGBT), are based on MOS control with bipolar current conduction in the lowly-doped drift layer or region of the device. Such devices are based on the conductivity modulation concept. At high levels of charge injection, when the current in the device increases, a mobile charge of electrons and of holes is built up in the drift layer, leading to a desirably sharp increase in the conductivity of the drift layer. The mobile charge accumulated when the device is in the on-state dictates the on-state/switching performance of the device given that the mobile carriers must be removed or "mopped up" in order to switch the device to the off-state.

MOS-bipolar devices, such as the LIGBT, can be broadly regarded as a low voltage MOS component driving a wide base (high voltage) bipolar transistor. By way of example, an n-channel LIGBT has an n-channel MOSFET driving the base of a pnp transistor. Such devices do not normally have reverse current conduction because, unlike in a MOSFET (or power MOSFET), there is no associated integral body diode. As is known, the integral body diode in a MOSFET is an intrinsic component of the MOS transistor and is connected in an anti-parallel configuration and allows for reverse current conduction.

In some applications and some architectures, such as half bridges or full bridges, reverse current conduction is necessary. In this respect, therefore, the MOSFET has an advantage over the IGBT in such applications as it has an intrinsic anti-parallel body diode.

Anode-shorted IGBTs are based on a combination of a MOSFET with an IGBT. They behave as MOSFETs until a certain current threshold is reached, above which they operate as an IGBT. These devices are generally faster than the conventional IGBTs and feature a body diode. A significant drawback of such arrangements however is that a sharp snap-back is seen in the output characteristics when the device commutes from the MOSFET mode (unipolar mode) to the IGBT mode (bipolar mode). There is therefore a very difficult trade-off in anode-shorted devices between the IGBT and the body diode performance. In general, a high performance diode comes with a significant snap-back and thus is an unacceptable solution. Reducing the snap-back however kills the diode output power to an extent that is almost un-usable.

Examples of anode-shorted IGBTs or double gate devices are disclosed in F. Udrea, G. A. J. Amaratunga, J. Humphrey, J. Clark and A. Evans, "The MOS Inversion Layer as a Minority Carrier Injector", IEEE, Electron Device Letters, volume 17, no. 9, p. 425, September 1996; U. N. K. Udugampola, R. A. McMahon, F. Udrea, K. Sheng, G. A. J. Amaratunga, E. M. S. Narayanan, S. Hardikar, and M. M. De Souza, "Dual Gate Lateral Inversion Layer Emitter Transistor for Power and High Voltage Integrated Circuits", International Symposium on power semiconductor devices and ICs, Cambridge 2003, p. 216-219; F. Udrea, U. N. K. Udugampola, K. Sheng, R. A. McMahon, G. A. J. Amaratunga, E. M. S. Narayanan, M. M. De Souza, and S. Hardikar, "Experimental Demonstration of an Ultra-fast Double Gate Inversion Layer Emitter Transistor (DG-ILET)", IEEE Electron Device Letters, Volume 23, Issue 12, December 2002, p. 725-727; and H. Takahashi et al, "1200 V Reverse Conducting IGBT", ISPSD, p. 133, 2004.

Using a smart design in vertical devices, it is possible to build a relatively good trade-off between the diode and the IGBT performance, but still the conduction paths for the diodes and the IGBT are not exactly the same, which in effect means that an increase in area of the device is necessary to accommodate both components in one die.

SUMMARY OF THE INVENTION

According to a first aspect of the present invention, there is provided a bipolar high voltage/power semiconductor device, the device comprising:

a drift region of a first conductivity type and having first and second ends;

the first end of the drift region having adjacent thereto a region of the second conductivity type which is adjacent a region of the first conductivity type, at least said region of the first conductivity type being in electrical contact with a low voltage terminal;

the second end of the drift region having adjacent thereto a region of the first conductivity type which is adjacent a region of the second conductivity type, at least said region of the second conductivity type being in electrical contact with a high voltage terminal;

a first insulated gate terminal at or towards the first end of the drift region and positioned at least partly over the region of the second conductivity type at the first end of the drift region;

a second insulated gate terminal at or towards the second end of the drift region and positioned at least partly over the region of the first conductivity type at the second end of the drift region; and, one or more drive circuits constructed and arranged:

(i) to provide a voltage of a first polarity to the second insulated gate terminal relative to the high voltage terminal and to provide a voltage of a second, opposite polarity to the first insulated gate terminal relative to the low voltage terminal, so as to allow current conduction in a first direction; and, (ii) to provide a voltage of the second polarity to the second insulated gate terminal relative to the high voltage terminal and to provide a zero voltage or a voltage of the first polarity to the first insulated gate terminal relative to the low voltage terminal, so as to allow current conduction in a second direction that is opposite the first direction.

(As will be understood, in this context the "voltage of the first polarity" is negative and the "voltage of the second polarity" is positive if the drift region is n type, etc. In this context, in practice the "first direction" is commonly referred as the "forward direction" and the "second direction" is commonly referred as the "reverse direction". These terms "forward direction" and "reverse direction" will be used occasionally herein for ease of understanding for the reader, though it will be understood that this is solely for convenience. In a specific embodiment, the device operates as a lateral insulated gate bipolar transistor (LIGBT) in the first (forward) conduction mode and as an anti-parallel diode in the second (reverse) conduction mode.)

Thus, by appropriately arranging the voltages applied to the insulated gate terminals relative to the respective high and low voltage terminals, not only can current conduction in the first direction be achieved (as in the prior art device disclosed in for example "Dual Gate Lateral Inversion Layer Emitter Transistor for Power and High Voltage Integrated Circuits" referred to above), but also current conduction in the second, opposite direction can be achieved. This can be achieved in the preferred embodiment without having to increase the area of the device (for example, because it is not necessary to include specific anti-parallel diode components), without compromising the current carrying characteristics during current conduction in the first (forward) direction, without compromising the switch-off characteristics, and improving the snap-back characteristics of the device during switch-off of current conduction in the first (forward) direction.

The one or more drive circuits may be constructed and arranged:

(i) to provide a voltage of the second polarity to the high voltage terminal relative to the low voltage terminal during current conduction in the first direction; and, (ii) to provide a voltage of the first polarity to the high voltage terminal relative to the low voltage terminal during current conduction in the second direction.

The one or more drive circuits may be constructed and arranged:

(iii) to provide a zero voltage to the second insulated gate terminal relative to the high voltage terminal, to provide a zero voltage or voltage of the first polarity to the first insulated gate terminal relative to the low voltage terminal, and to provide a high voltage of the second polarity to the high voltage terminal relative to the low voltage terminal, so as to block current conduction in the first and second directions when the device is off or during the turn-off of the device.

In an embodiment, the first direction is the on-state forward direction in a lateral insulated gate bipolar transistor and the second direction is the on-state reverse conduction of an anti-parallel body diode present in the device.

In an embodiment, the device provides a lateral insulated gate bipolar transistor with an anti-parallel body diode whereby the operation of the LIGBT and the anti-parallel body diode respectively is controlled through the two insulated gates provided at the low voltage and high voltage terminals respectively.

The or each drive circuit may be external to the device. The or each drive circuit may be integrated within the same semiconductor chip with the device. At least one drive circuit may be external to the device and at least one drive circuit may be integrated within the same semiconductor chip with the device. In one embodiment, at least one drive circuit (which may be external to the device or integrated with the device on the same chip) is provided to provide the necessary drive voltages to the insulated gates and at least one drive circuit (which may be external to the device or integrated with the device on the same chip) is provided to provide the necessary drive voltages to the low and high voltage terminals.

The device may comprise a relatively highly doped region of the first conductivity type in electrical contact with the high voltage terminal, and a relatively lowly doped region of the first conductivity type between the region of the first conductivity type that is adjacent the second end of the drift region and said relatively highly doped region of the first conductivity type. This helps to further minimise the effect of the snap-back.

The device may comprise plural alternating regions of first and second conductivity type adjacent said region of the first conductivity type that is adjacent the second end of the drift region, said alternating regions of first and second conductivity type all being in electrical contact with the high voltage terminal. In this example, the device may comprise a relatively lowly doped region of the first conductivity type between the region of the first conductivity type that is adjacent the second end of the drift region and at least the regions of the first conductivity type that are in electrical contact with the high voltage terminal. This helps to further minimise the effect of the snap-back. There may be plural relatively lowly doped regions of the first conductivity type respectively between the regions of the first conductivity type that are in electrical contact with the high voltage terminal and the relatively lowly doped region of the first conductivity type. This helps to minimise yet further the effect of the snap-back.

According to a second aspect of the present invention, there is provided a method of operating a bipolar high voltage/power semiconductor device, the device comprising: a drift region of a first conductivity type and having first and second ends; the first end of the drift region having adjacent thereto a region of the second conductivity type which is adjacent a region of the first conductivity type, at least said region of the first conductivity type being in electrical contact with a low voltage terminal; the second end of the drift region having adjacent thereto a region of the first conductivity type which is adjacent a region of the second conductivity type, at least said region of the second conductivity type being in electrical contact with a high voltage terminal; a first insulated gate terminal at or towards the first end of the drift region and positioned at least partly over the region of the second conductivity type at the first end of the drift region; and, a second insulated gate terminal at or towards the second end of the drift region and positioned at least partly over the region of the first conductivity type at the second end of the drift region, the method comprising:

selectively applying:

(i) a voltage of a first polarity to the second insulated gate with respect to the voltage applied to the high voltage terminal to form an inversion layer in at least said part of the region of the first conductivity type and the drift region that are under the second insulated gate and to allow current conduction in a first direction, and (ii) a voltage of a second, opposite polarity to the second insulated gate with respect to the voltage applied to the high voltage terminal to form an accumulation layer in at least said part of the region of the first conductivity type and the drift region that are under the second insulated gate and to allow current conduction in a second direction.

(As will be understood, in this context the "voltage of the first polarity" is negative and the "voltage of the second polarity" is positive if the drift region is n type, etc. and the terms "inversion layer" and "accumulation layer" are used accordingly. An inversion layer is a surface layer of mobile carriers that has an opposite conductivity type to the background region. An accumulation layer is a surface layer of mobile carriers that has the same conductivity type as the background region and has higher (in practice considerably higher) concentration than the background doping concentration. In this context, again in practice the "first direction" is commonly referred as the "forward direction" and the "second direction" is commonly referred as the "reverse direction".)

The formation of the inversion layer increases the efficiency of injection of the corresponding charge carriers and increases the emitting area, and reduces the snap-back when the device conducts in the first direction (i.e. the "forward direction"). The formation of the accumulation layer increases the efficiency of injection of the corresponding charge carriers and reduces the on-state resistance when conducting current in the second direction (i.e. the "reverse direction").

The method preferably comprises:

(i) applying a voltage of the second polarity to the high voltage terminal relative to the low voltage terminal during current conduction in the first direction; and, (ii) applying a voltage of the first polarity to the high voltage terminal relative to the low voltage terminal during current conduction in the second direction.

The method preferably comprises:

(iii) selectively providing a zero voltage to the second insulated gate terminal relative to the high voltage terminal, providing a zero voltage or voltage of the first polarity to the first insulated gate terminal relative to the low voltage terminal, and providing a high voltage of the second polarity to the high voltage terminal relative to the low voltage terminal, so as to block current conduction in the first and second directions when the device is off or during the turn-off of the device.

According to a third aspect of the present invention, there is provided a method of operating a semiconductor device, the device having a drift region of a first conductivity type, a first buffer/well region of a second conductivity type at one end of the drift region, a second buffer/well region of the first conductivity type at the other end of the drift region, a first relatively highly doped region of the first conductivity type adjacent the first buffer/well region, a second relatively highly doped region of the second conductivity type adjacent the second buffer/well region, a first terminal in electrical contact with the first buffer/well region and the first relatively highly doped region of the first conductivity type adjacent the first buffer/well region, a second terminal in electrical contact with the second buffer/well region and the second relatively highly doped region of the second conductivity type adjacent the second buffer/well region, a first insulated gate over at least the first buffer/well region and the adjacent end of the drift region, and a second insulated gate over at least the second buffer/well region and the adjacent end of the drift region, the method comprising:

varying the relative voltages applied to the first terminal, the second terminal, the first insulated gate and the second insulated gate so as to switch the device between (i) blocking current conduction in both directions, (ii) providing an insulated-gate bipolar transistor (IGBT) mode of conduction in a first direction and (iii) providing an anti-parallel diode mode of conduction in a second direction.

The preferred embodiment provides a dual gate device that allows optimisation of the performance trade-off between the IGBT and the diode modes of operation.

For the reader's convenience, it is mentioned here that in the specific examples below the first buffer/well region is referred to as the p-well; the second buffer/well region is referred to as the n-buffer; the first terminal or the low voltage terminal is referred to as the cathode terminal; the second terminal or the high voltage terminal is referred to as the anode terminal; the first insulated gate terminal is referred to as the cathode gate; the second insulated gate terminal is referred to as the anode gate; and the drift region is of n-type. The anode gate is placed above the n− buffer and the cathode gate is placed above the p-well.

The second insulated gate, which is referred to as the anode gate in the specific examples below in which the drift region is of n type, adjusts the IGBT versus diode performance. The device of the preferred embodiment offers the following advantages (again, referring simply to "anode" and "cathode", and thus "negative" and "positive" voltages for convenience):

(i) fast speed: the anode junction can be shorted and can therefore reduce the excess mobile charge in the on-state (referred to as plasma), and thus reduce the time and energy losses during turn-off of the IGBT;

(ii) minimised or suppressed snap-back: when the second insulated gate (the anode gate) is biased negatively with respect to the anode, in the specific examples, a hole inversion layer is formed at the surface of the n− well buffer and the n− drift region. This inversion layer connects to the p+ anode layer, in effect enhancing the hole injection and allowing a good on-state performance of the IGBT. This inversion layer also helps to reduce the snap-back or even suppress it.

(iii) high current capability anti-parallel diode: when the second gate is biased positively with respect to the anode, in the specific examples, an electron accumulation layer is formed at the surface of the n− well and the n− drift which connects to the n+ anode region (this region is shorted to the p+ anode region and is in direct contact with the high voltage terminal) of the diode. This accumulation layer increases the current capability of the diode.

Both the IGBT and the diode may use exactly the same conduction area and therefore no increase in the area of the device is necessary, unlike the case for conventional vertical devices discussed above.

The layers used may all be formed as part of the CMOS and HV CMOS process and therefore no additional process steps are necessary during manufacture of the device.

The second insulated gate (i.e. the anode gate) can be controlled smartly to optimise the speed of switching off of the power device and/or transition from the IGBT mode to the diode mode.

The second insulated gate (i.e. the anode gate) in a specific example can also be biased positively with respect to the anode during the turn-off of the IGBT to increase the switching speed of the IGBT.

The first insulated gate (i.e. the cathode gate) can be operated concomitantly with the second insulated gate (i.e. the anode gate). For example, for the IGBT to turn on, the first insulated gate (i.e. the cathode gate) may be switched with respect to the cathode from 0V to +5V while the second insulated gate(i.e. the anode gate) is switched with respect to the anode from 0V to −5V. For the IGBT to be turned off and the diode to be turned on, the first insulated gate (i.e. the cathode gate) may be switched from 5V to 0V (or less commonly −5 V) while the second gate is switched from −5V to +5V.

BRIEF DESCRIPTION OF THE DRAWINGS

Embodiments of the present invention will now be described by way of example with reference to the accompanying drawings, in which.

DETAILED DESCRIPTION

Figure 1:
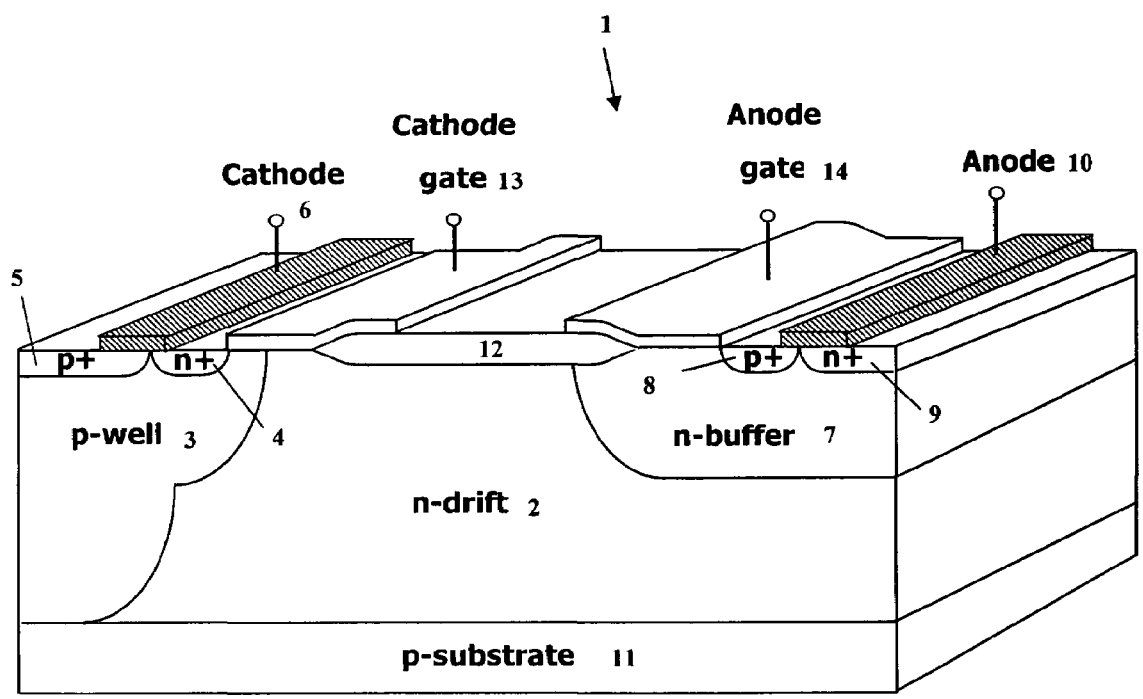
FIGS. 1 to 4 respectively show schematically perspective views of four examples of a lateral insulated gate bipolar transistor (LIGBT) according to an embodiment of the present invention.

Referring now to the drawings, FIG. 1 shows schematically a perspective view of a first example of a high voltage/power lateral insulated gate bipolar transistor (LIGBT) device 1 according to an embodiment of the present invention. This example uses junction isolation technology, which is known per se. The device 1 has an n-drift region 2 having first and second ends.

At the first end of the drift region 2 there is a p-well region 3 which is adjacent to an n+ cathode region 4. In this example, the n+ cathode region 4 is formed in the p-well 3. In this example, a p+ region 5 is also formed in the p-well 3 on the opposite side of the n+ cathode region 4 to the n-drift region 2. A low voltage, "cathode" terminal 6 is in electrical contact with at least a part of the n+ cathode region 4 and, in this example, is also in electrical contact with at least a part of the p+ region 5.

At the second end of the drift region 2 is an n-buffer region or well 7 which is adjacent to a p+ anode region 8. In this example, the p+ anode region 8 is formed in the n-buffer well 7. In this example, an n+ region 9 is also formed in the n-buffer well 7 on the opposite side of the p+ anode region 8 to the n-drift region 2. A high voltage, "anode" terminal 10 is in electrical contact with at least a part of the p+ anode region 8 and, in this example, is also in electrical contact with at least a part of the n+ region 9.

The active layers and regions described above are formed on a p silicon substrate 11.

An insulating layer of silicon oxide 12 is formed over at least a part of surface of the drift region 2. A first gate electrode 13, termed herein the "cathode gate" 13, is provided towards the first end of the drift region 2 to extend over at least a part of the oxide layer 12 at that end, the adjacent portion of the first end of the drift region 2 and a part of the adjacent portion of the p-well 3. A second gate electrode 14, termed herein the "anode gate" 14, is provided towards the second end of the drift region 2 to extend over at least a part of the oxide layer 12 at that end, the adjacent portion of the second end of the drift region 2 and a part of the adjacent portion of the n-buffer 7.

Figure 2:
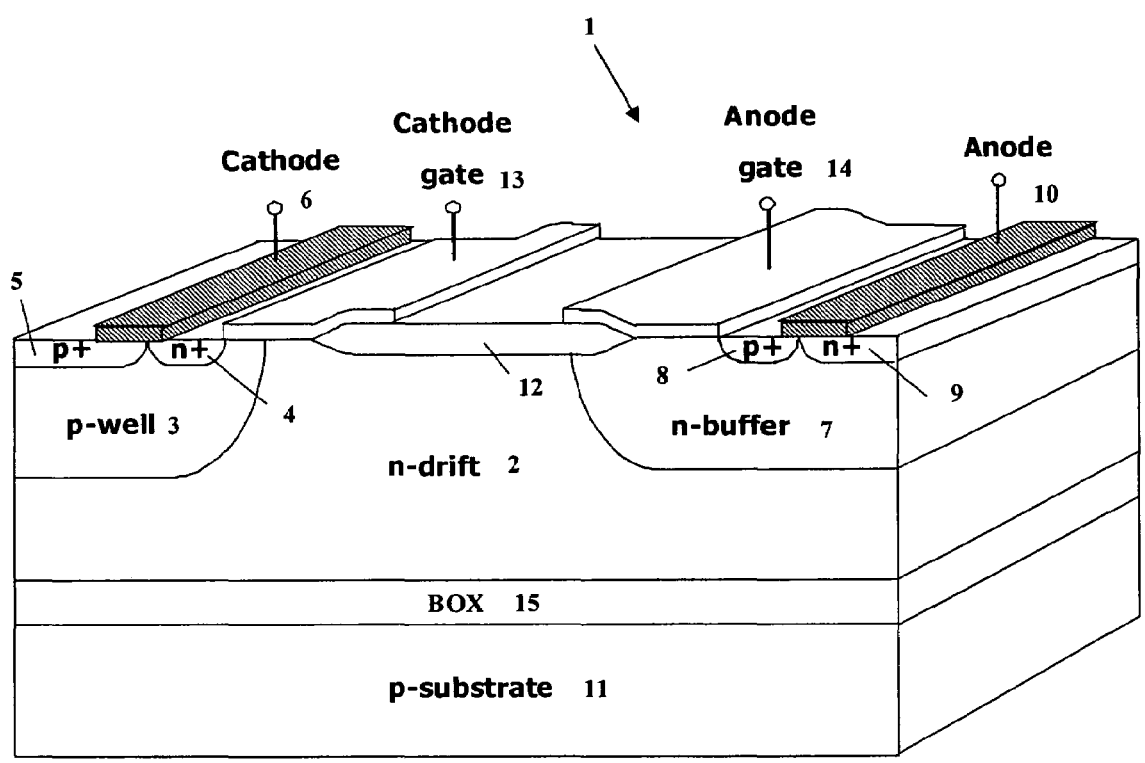

FIG. 2 shows schematically a perspective view of a second example of a high voltage/power lateral insulated gate bipolar transistor (LIGBT) device 1 according to an embodiment of the present invention. This example is similar to the first example shown in FIG. 1 and like parts have the same reference numerals. Instead of using junction isolation technology, this second example uses thick SOI (Silicon on Insulator) technology. In particular, a buried oxide layer 15 separates the drift region 2 and the substrate 11.

Figure 3:
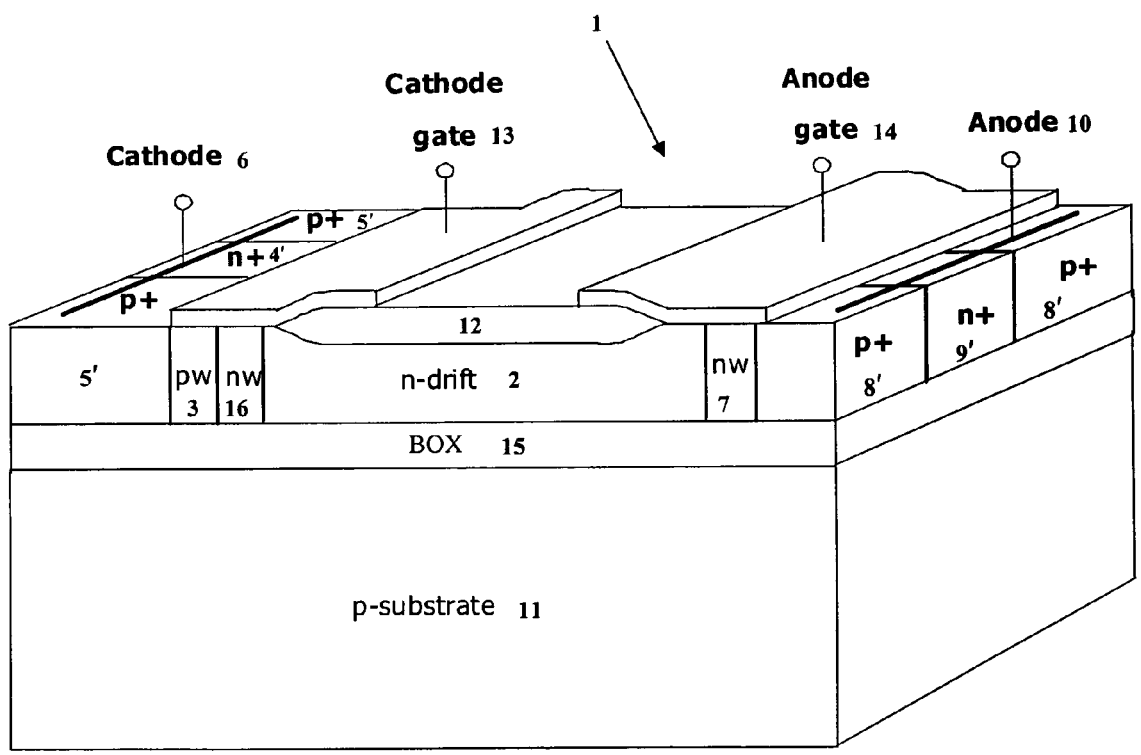

FIG. 3 shows schematically a perspective view of a third example of a high voltage/power lateral insulated gate bipolar transistor (LIGBT) device 1 according to an embodiment of the present invention. This example is similar to the second example shown in FIG. 2 and like parts have the same reference numerals. In this third example, the buried oxide layer 15 is relatively thin compared to the relatively thick substrate 11. Moreover, in this example, alternating p+ regions 8' (two being shown here) and n+ regions 9' (one being shown here) are provided behind the n-buffer well 7 at the anode end. The alternating p+ regions 8' and n+ regions 9' are short-circuited to each other by all being electrically connected to the anode terminal 10. Similarly, in this example, alternating p+ regions 5' (two being shown here) and n+ regions 4' (one being shown here) are provided behind the p-well 3 at the cathode end. The alternating p+ regions 5' and n+ regions 4' are short-circuited to each other by all being electrically connected to the cathode terminal 6. In addition, a further n-well 16 is provided between the first end of the n-drift region 2 and the p-well 3 at the cathode end.

Figure 4:
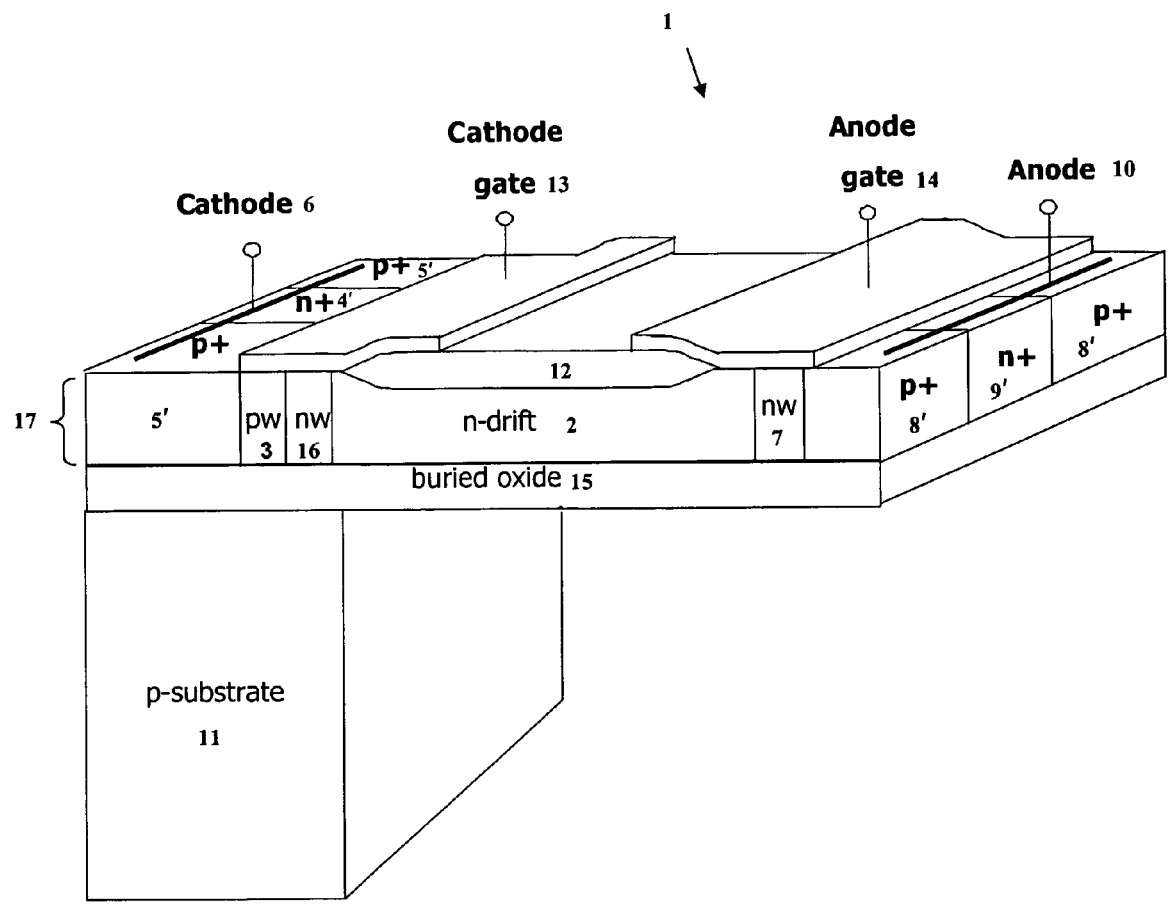

FIG. 4 shows schematically a perspective view of a fourth example of a high voltage/power lateral insulated gate bipolar transistor (LIGBT) device 1 according to an embodiment of the present invention. This example is similar to the third example shown in FIG. 3 and like parts have the same reference numerals. In this fourth example, as well as using a buried oxide layer 15 typical of SOI technology, "membrane" technology is used to improve the electrical field distribution within the drift region 2 in operation. Membrane technology is discussed more fully in our WO-A-02/25700, U.S. Pat. No. 6,703,684, U.S. Pat. No. 6,900,518, U.S. Pat. No. 6,927,102, U.S. patent application Ser. Nos. 11/174605 and 11/174606, and other related patents and patent applications, the entire contents of which are hereby incorporated by reference.

The basic operation of all of these examples is the same. The first, "cathode" gate 13 determines whether the IGBT 1 is on or off. The second, "anode" gate 14 determines whether the IGBT 1 or the diode is active for forward and reverse conduction respectively in the on-state. If the second, "anode" gate 14 is not used (e.g. by being short-circuited to the anode terminal 10), the anode-shorted like structure is obtained. In this mode the device 1 cannot offer a beneficial trade-off between the IGBT on-state performance and the diode on-state performance.

When the second, "anode" gate 14 is biased negatively with respect to the anode terminal 10, a hole inversion layer is formed at the surface of the n-well (n-buffer) 7 and the n-drift region 2 below the insulated second, "anode" gate 14. This leads to (i) reduced snap-back characteristics due to hole injection at lower current densities and (ii) increased emitter area, which leads to slightly higher hole injection and, as a result, lower on-state voltage drop after the snap-back during the on-state. An optimal design of the anode layers can result in a minimal or virtually non-existent snap-back.

If the second, "anode" gate 14 is biased positively with respect to the anode terminal 10, an electron accumulation layer is formed at the surface of the n-well (n-buffer) 7 and the n-drift region 2 below the insulated second, "anode" gate 14. This leads to an enhanced connection of the drift region 2 to the n+ anode region 9 (or 9') which is shorted to the p+ anode region 8 (or 8') and in direct contact with the anode terminal 10. The electron accumulation layer facilitates electron injection into the drift region 2, leading to high conductivity modulation and hence good on-state performance during reverse conduction when the device 1 is effectively operating as an anti-parallel diode.

The table below summarises the preferred biasing of the first (cathode) and second (anode) insulated gates for various modes of operation of the device:

|  | Cathode potential | Cathode gate with respect to cathode | Anode potential with respect to cathode potential | Anode gate with respect to anode |
|---|---|---|---|---|
| LIGBT ON-state | 0 | + | + | − |
| Anti parallel diode ON-state | 0 | 0 (or −) | − | + |
| LIGBT/Anti parallel diode off state | 0 | 0 (or −) | + + | 0 |
| LIGBT ON → OFF | 0 | + → 0 (or −) | + → + + | − → 0 (or +) |
| LIGBT OFF → ON | 0 | 0 (or −) → + | + + → + | 0 (or +) → − |
| LIGBT → Anti parallel diode transient | 0 | + → 0 (or −) | + → − | − → + |
| Anti parallel diode → LIGBT | 0 | 0 (or −) → + | − → + | + → − |

Figure 11:
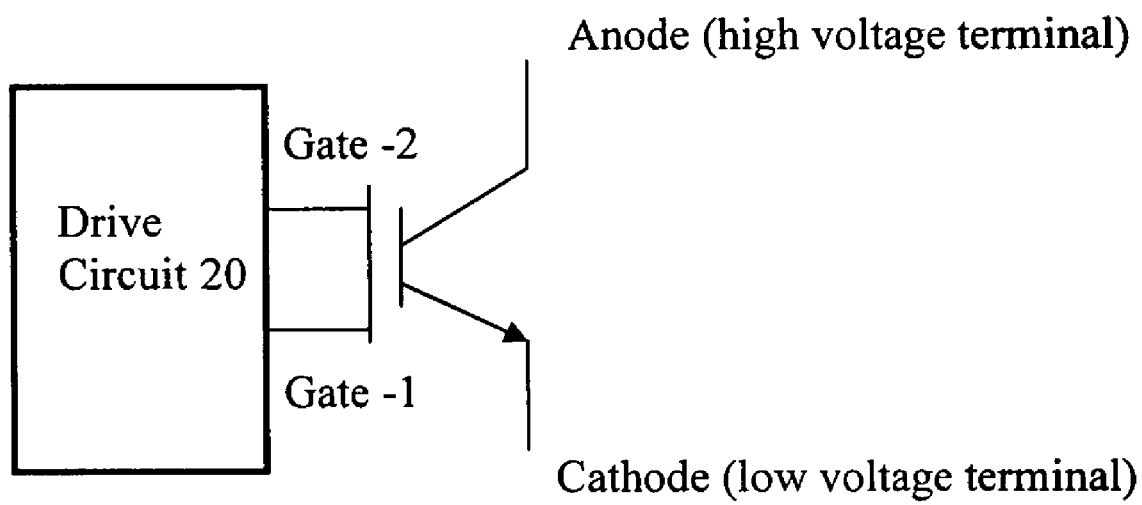

An arrow → indicates a time transition from one state to another.
++ refers to a high positive potential (e.g. 300 V).
+ refers to a positive potential (e.g. −5 V).
− refers to a negative potential The biasing of the gates can be provided by a drive circuit 20, an example of which is shown schematically in FIG. 11, which is connected to gates of the device 1. Preferably such circuit 20 can be integrated within the same semiconductor chip or the same package as the device 1. Alternatively, the drive circuit 20, or parts of the drive circuit 20, can be external to the device 1 (i.e. not within the same package). Indeed, separate drive circuits may be provided for driving the insulated gates 13,14 and the low and high voltage terminals 6,10 respectively.

Figure 5:
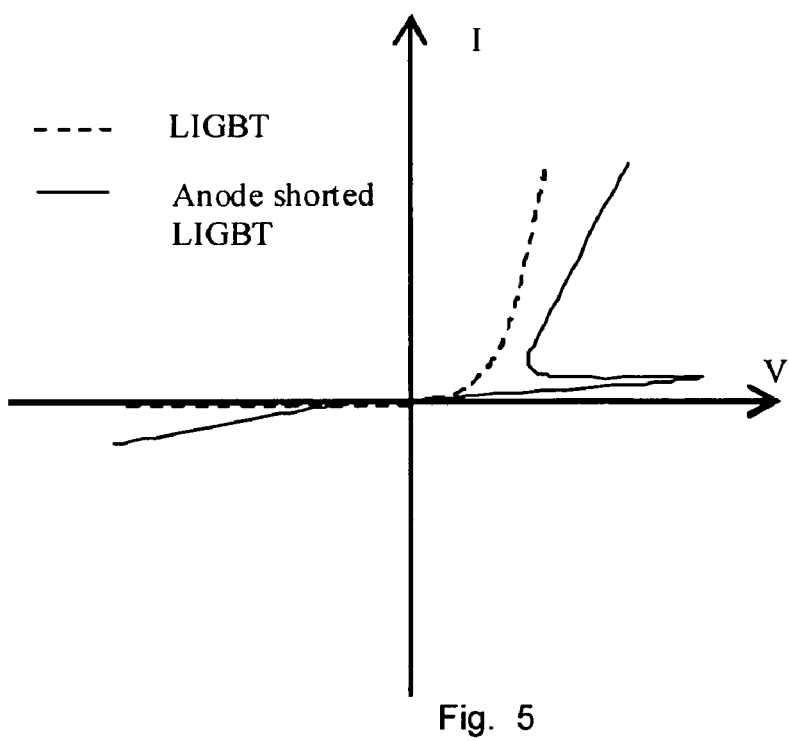
FIG. 5 shows schematically typical characteristics of a standard, prior art LIGBT and a prior art anode-shorted LIGBT during the forward and reverse on-states.

FIG. 5 shows schematically the typical operating characteristics of a standard, prior art LIGBT (dashed lines) and a prior art anode-shorted LIGBT (solid lines) during the forward and reverse on-states. As can be seen, the standard LIGBT does not have any reverse conduction capability. The anode-shorted LIGBT has some reverse conduction capability, but suffers from a very tight trade-off between a good diode performance and a reasonable snap-back voltage. Therefore the use of the anode-shorted LIGBT as a device with reverse conduction capability is limited.

Figure 6:
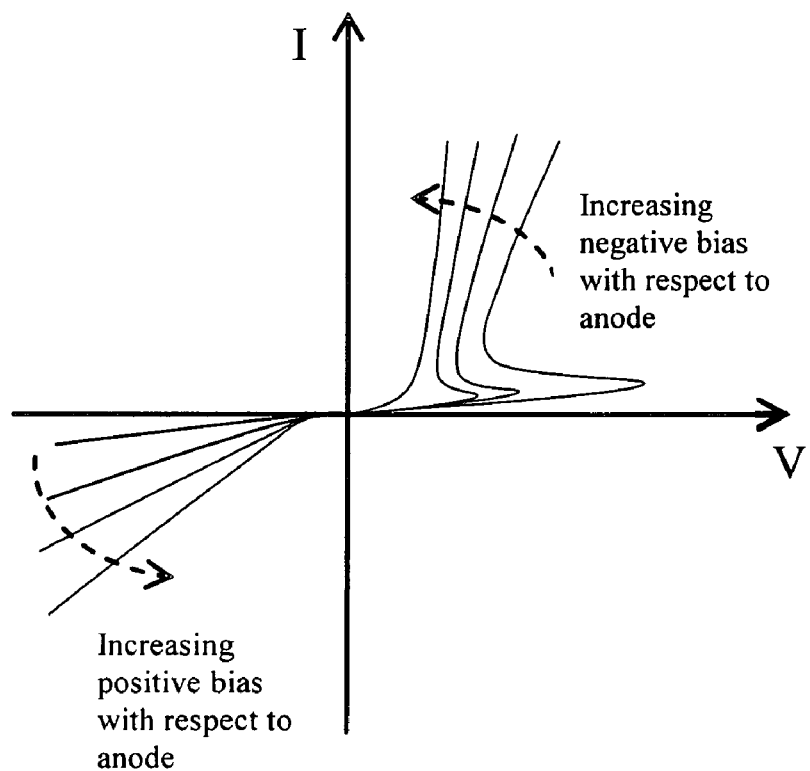
FIG. 6 shows schematically typical characteristics of 15 an example of an LIGBT according to an embodiment of the present invention during the forward and reverse on-states.

FIG. 6 shows schematically the typical operating characteristics of an example of a device 1 according to an embodiment of the present invention. As a function of the potential of the second, anode gate 14 with respect to the potential of the anode 10, the device 1 can adjust the snap-back voltage and allow reverse conduction through the anti-parallel diode that is effectively formed. Both the IGBT and diode characteristics are controlled by the anode gate 14. When operated as an IGBT (i.e. in forward current conduction), the cathode gate 6 is ON. When operated as an anti-parallel diode (i.e. in reverse current conduction) the cathode gate 6 is OFF.

Figure 7:
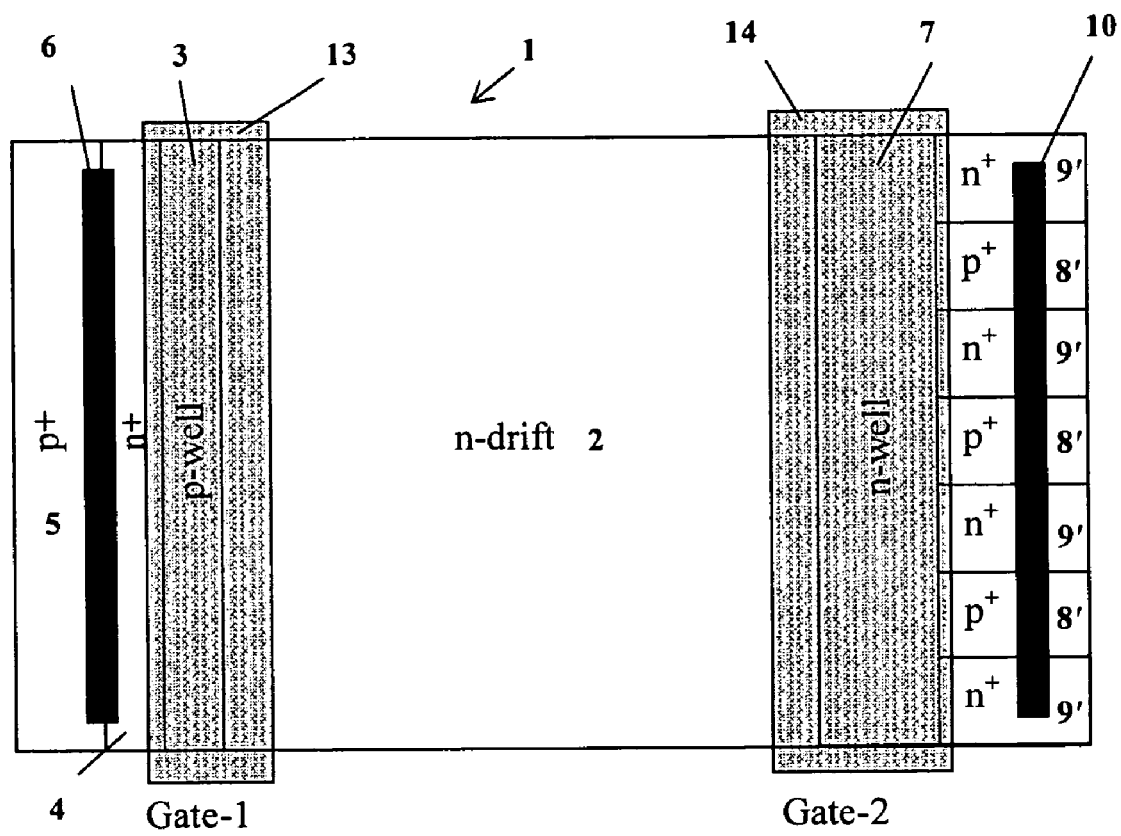
FIGS. 7 to 10 respectively show schematically plan 20 views of four further examples of a lateral insulated gate bipolar transistor (LIGBT) according to an embodiment of the present invention; and, FIG. 11 shows schematically a drive circuit arranged to drive the gates of a lateral insulated gate bipolar transistor.
Figure 8:
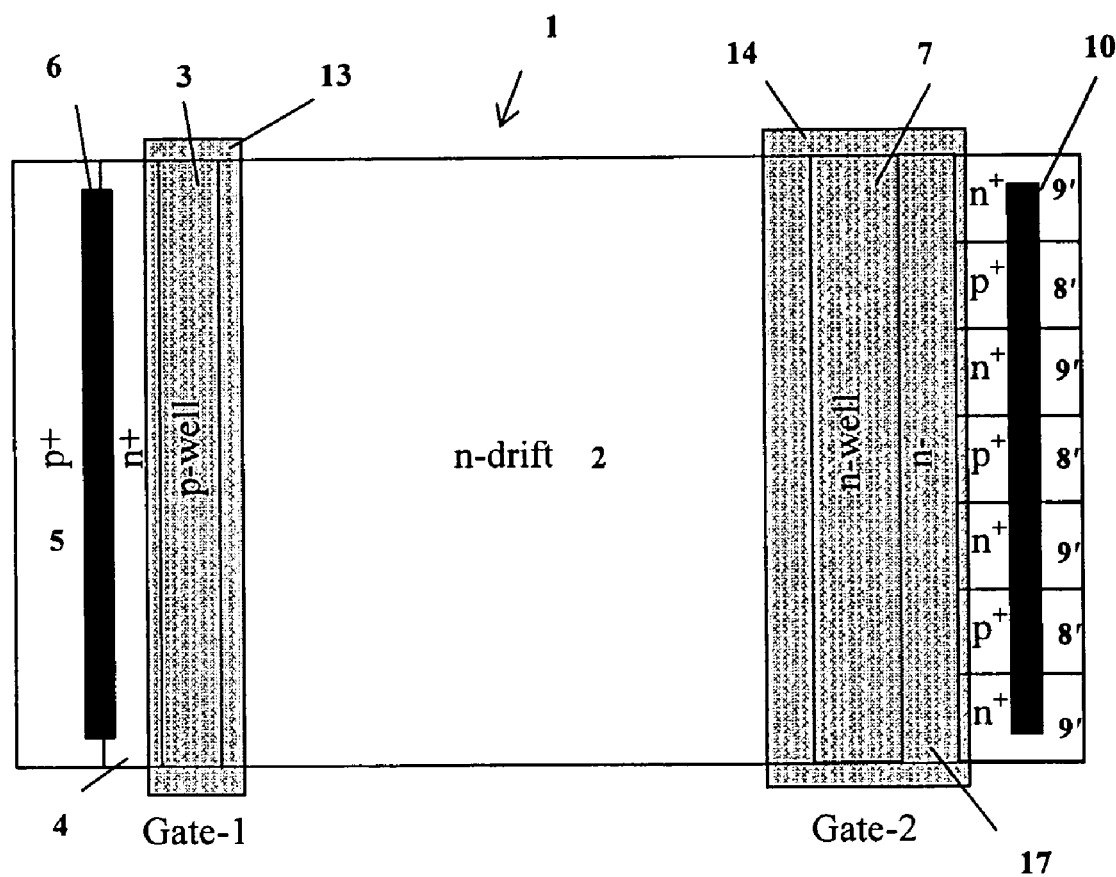
Figure 9:
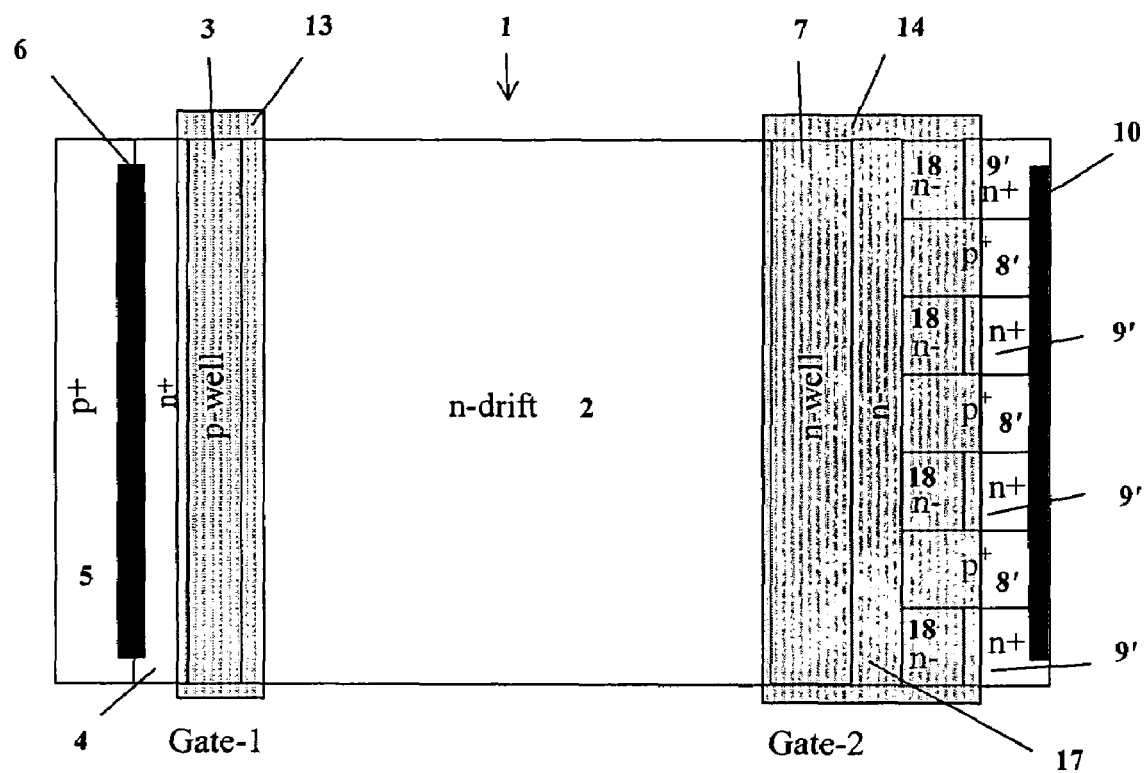

FIGS. 7 to 9 show schematic plan views of further examples of devices 1 according to embodiments of the present invention. For like parts, the same reference numerals are used as for the examples discussed above.

In the example of FIG. 7, plural n+/p+ anode regions 9', 8' are placed alternatively next to each other at the anode end and short-circuited to the anode terminal 10. The n-well 7 serves as a buffer layer to modulate the injection efficiency of the anode junction and to protect the device 1 against punch-through during the voltage blocking mode. The anode gate 14 is placed above the n-well 7 and partly above the n+/p+ regions 9', 8' and partly above the n-drift region 2.

When the anode gate 14 is biased negatively, e.g. at −5 V, with respect to the anode terminal 10, a hole inversion layer is formed at the surface of the n-well 7 and the part of the n-drift region 2 below the insulated anode gate 14. This inversion layer with its high concentration of holes acts as an extension of the p+ regions 8', increasing the anode injection efficiency and the emitting area. It also increases the resistance that electrons see from the n-drift region 2 to the n+ anode short regions 9', thus reducing the snap-back.

When the anode gate 14 is biased positively, e.g. at +5 V, with respect to the cathode terminal 6, an electron accumulation layer is formed at the surface of the n-well 7 and the part of the n-drift region 2 below the insulated anode gate 14. This accumulation layer with its high concentration of electrons acts as an extension of the n+ regions 9', increasing the injection efficiency of the n+/n-well junction 9'/7 and cutting down the resistance that electrons see when injected by the anode terminal 10 in the reverse conduction mode. Thus, in this mode the device 1 is operated as an anti-parallel diode (i.e. with reverse current conduction) and the on-state performance of the diode is significantly improved by the application of an appropriate positive voltage to the anode gate 14 with respect to the anode terminal 10.

FIG. 8 shows an example of a device 1 in which a further n− region 17 is placed between the n-buffer region 7 and the n+ anode shorts 9'. This further n− region 17 is fully covered by the insulated anode gate 14 and therefore its surface charge is dictated by the biasing of the anode gate 14. This design helps to further minimise the effect of the snap-back.

FIG. 9 shows a variation of the example of FIG. 8 in which the n+ anode regions 9' are placed behind n− regions 18 and adjacent to the p+ regions 8'. The n+ anode regions 9' are thus separated from the further n− region 17 by the n− regions 18. This allows an increase in the resistance for the electrons travelling to the n+ shorts 9' through the n− regions 17, 18, and thus further minimises the snap-back during the IGBT forward conduction.

Figure 10:
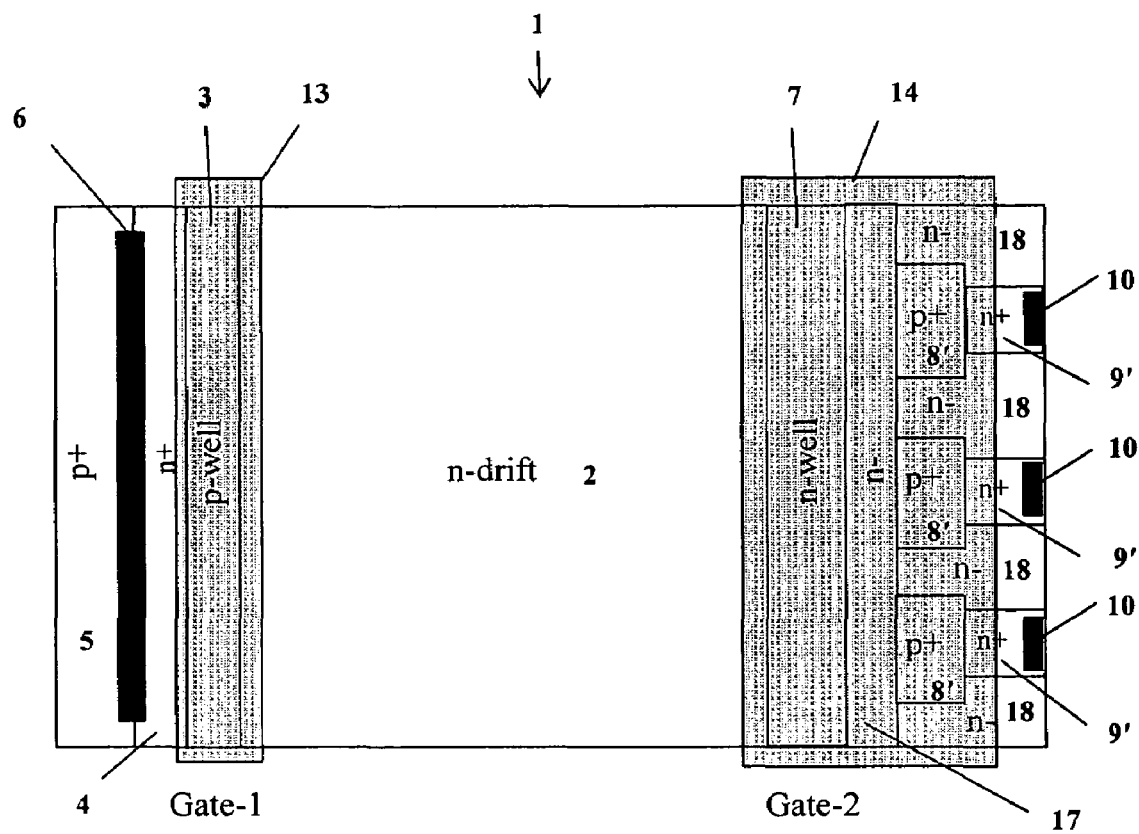

FIG. 10 shows a variation of the example of FIG. 9 in which the n+ anode regions 9' are placed behind the p+ anode regions 8'. The electrode 10 contacts the n+ regions 9' (shown) and the p+ regions 8' (not shown). The placement of the n+ regions 9' behind the p+ regions 8' allows an increase in the resistance for the electrons travelling through the high resistance n− regions 17,18 to the n+ shorts 9' and thus further minimises the snap-back during the IGBT forward conduction.

It is worth noting that the n− drift region 2 under the insulated anode gate 14 gets fully accumulated with mobile electrons when the device 1 is operated as an anti-parallel diode with a positive voltage on the anode gate 14. Thus, the examples of FIGS. 8, 9 and 10 when compared to that of FIG. 7 facilitate a less snappy (or no snappy) forward characteristic of the IGBT 1, but have little impact on the on-state characteristics of the anti-parallel diode.

Embodiments of the present invention have been described with particular reference to the examples illustrated. However, it will be appreciated that variations and modifications may be made to the examples described within the scope of the present invention.

The invention claimed is:

1. A bipolar high voltage/power semiconductor device, the device comprising:
   a drift region of a first conductivity type and having first and second ends;
   the first end of the drift region having adjacent thereto a region of a second conductivity type which is adjacent a region of the first conductivity type, at least said region of the first conductivity type being in electrical contact with a low voltage terminal such that charge carriers of the first conductivity type are injected into the drift region from said region of the first conductivity type when the device is in the on-state and providing current conduction in a first direction;
   the second end of the drift region having adjacent thereto a region of the first conductivity type which is adjacent a region of the second conductivity type, at least said region of the second conductivity type being in electrical contact with a high voltage terminal such that charge carriers of the second conductivity type are injected into the drift region from said region of the second conductivity type when the device is in the on-state and providing current conduction in said first direction;
   a first insulated gate terminal at or towards the first end of the drift region and positioned at least partly over the region of the second conductivity type at the first end of the drift region;
   a second insulated gate terminal at or towards the second end of the drift region and positioned at least partly over the region of the first conductivity type at the second end of the drift region; and,
   one or more drive circuits constructed and arranged:
   (i) to provide a voltage of a first polarity to the second insulated gate terminal relative to the high voltage terminal and to provide a voltage of a second, opposite polarity to the first insulated gate terminal relative to the low voltage terminal, so as to allow current conduction in said first direction; and,
   (ii) to provide a voltage of the second polarity to the second insulated gate terminal relative to the high voltage terminal and to provide a zero voltage or a voltage of the first polarity to the first insulated gate terminal relative to the low voltage terminal, so as to allow current conduction in a second direction that is opposite the first direction.

2. A device according to claim 1, wherein the one or more drive circuits are constructed and arranged:
   (i) to provide a voltage of the second polarity to the high voltage terminal relative to the low voltage terminal during current conduction in the first direction; and,
   (ii) to provide a voltage of the first polarity to the high voltage terminal relative to the low voltage terminal during current conduction in the second direction.

3. A device according to claim 1, wherein the one or more drive circuits are constructed and arranged:
   (iii) to provide a zero voltage to the second insulated gate terminal relative to the high voltage terminal, to provide a zero voltage or voltage of the first polarity to the first insulated gate terminal relative to the low voltage terminal, and to provide a high voltage of the second polarity to the high voltage terminal relative to the low voltage terminal, so as to block current conduction in the first and second directions when the device is off or during the turn-off of the device.

4. A device according to claim 1, wherein the first direction is the on-state forward direction in a lateral insulated gate bipolar transistor and the second direction is the on-state reverse conduction of an anti-parallel body diode present in the device.

5. A device according to claim 1, wherein the device provides a lateral insulated gate bipolar transistor with an anti-parallel body diode whereby the operation of the LIGBT and the anti-parallel body diode respectively is controlled through the two insulated gates provided at the low voltage and high voltage terminals respectively.

6. A device according to claim 1, wherein the or each drive circuit is external to the device.

7. A device according to claim 1, wherein the or each drive circuit is integrated within the same semiconductor chip with the device.

8. A device according to claim 1, wherein at least one drive circuit is external to the device and at least one drive circuit is integrated within the same semiconductor chip with the device.

9. A device according to claim 1, comprising a relatively highly doped region of the first conductivity type in electrical contact with the high voltage terminal, and a relatively lowly doped region of the first conductivity type between the region of the first conductivity type that is adjacent the second end of the drift region and said relatively highly doped region of the first conductivity type.

10. A device according to claim 1, comprising plural alternating regions of first and second conductivity type adjacent said region of the first conductivity type that is adjacent the second end of the drift region, said alternating regions of first and second conductivity type all being in electrical contact with the high voltage terminal.

11. A device according to claim 10, comprising a relatively lowly doped region of the first conductivity type between the region of the first conductivity type that is adjacent the second end of the drift region and at least the regions of the first conductivity type that are in electrical contact with the high voltage terminal.

12. A device according to claim 11, comprising plural relatively lowly doped regions of the first conductivity type respectively between the regions of the first conductivity type that are in electrical contact with the high voltage terminal and the relatively lowly doped region of the first conductivity type.

13. A device according to claim 1, further comprising an insulating layer formed over at least a part of a surface of the drift region.

14. A method of operating a bipolar high voltage/power semiconductor device, the device comprising: a drift region of a first conductivity type and having first and second ends; the first end of the drift region having adjacent thereto a region of a second conductivity type which is adjacent a region of the first conductivity type, at least said region of the first conductivity type being in electrical contact with a low voltage terminal such that charge carriers of the first conductivity type are injected into the drift region from said region of the first conductivity type when the device is in the on-state and providing current conduction in a first direction; the second end of the drift region having adjacent thereto a region of the first conductivity type which is adjacent a region of the second conductivity type, at least said region of the second conductivity type being in electrical contact with a high voltage terminal such that charge carriers of the second conductivity type are injected into the drift region from said region of the second conductivity type when the device is in the on-state and providing current conduction in said first direction; a first insulated gate terminal at or towards the first end of the drift region and positioned at least partly over the region of the second conductivity type at the first end of the drift region; and, a second insulated gate terminal at or towards the second end of the drift region and positioned at least partly over the region of the first conductivity type at the second end of the drift region, the method comprising:
  selectively applying:
  (i) a voltage of a first polarity to the second insulated gate with respect to the voltage applied to the high voltage terminal to form an inversion layer in at least said part of the region of the first conductivity type and the drift region that are under the second insulated gate and to allow current conduction in said first direction, and
  (ii) a voltage of a second, opposite polarity to the second insulated gate with respect to the voltage applied to the high voltage terminal to form an accumulation layer in at least said part of the region of the first conductivity type and the drift region that are under the second insulated gate and to allow current conduction in a second direction.

15. A method according to claim 14, comprising:
  (i) applying a voltage of the second polarity to the high voltage terminal relative to the low voltage terminal during current conduction in the first direction; and,
  (ii) applying a voltage of the first polarity to the high voltage terminal relative to the low voltage terminal during current conduction in the second direction.

16. A method according to claim 14, comprising:
  (iii) selectively providing a zero voltage to the second insulated gate terminal relative to the high voltage terminal, providing a zero voltage or voltage of the first polarity to the first insulated gate terminal relative to the low voltage terminal, and providing a high voltage of the second polarity to the high voltage terminal relative to the low voltage terminal, so as to block current conduction in the first and second directions when the device is off or during the turn-off of the device.

17. A method according to claim 14, wherein the first direction is the on-state forward direction in a lateral insulated gate bipolar transistor and the second direction is the on-state reverse conduction of an anti-parallel body diode present in the device.

18. A method according to claim 14, wherein the device provides a lateral insulated gate bipolar transistor with an anti-parallel body diode whereby the operation of the LIGBT and the anti-parallel body diode respectively is controlled through the two insulated gates provided at the low voltage and high voltage terminals respectively.

19. A method of operating a semiconductor device, the device having a drift region of a first conductivity type, a first buffer/well region of a second conductivity type at one end of the drift region, a first relatively highly doped region of the first conductivity type adjacent the first buffer/well region, a first terminal in electrical contact with the first buffer/well region and the first relatively highly doped region of the first conductivity type adjacent the first buffer/well region, a first insulated gate over at least the first buffer/well region and the adjacent end of the drift region, such that charge carriers of the first conductivity type are injected into the drift region from said relatively highly doped region of the first conductivity type when the device is in the on-state and providing current conduction in a first direction, and a second buffer/well region of the first conductivity type at the other end of the drift region, a second relatively highly doped region of the second conductivity type adjacent the second buffer/well region, a second terminal in electrical contact with the second buffer/well region and the second relatively highly doped region of the second conductivity type adjacent the second buffer/well region, and a second insulated gate over at least the second buffer/well region and the adjacent end of the drift region, such that charge carriers of the second conductivity type are injected into the drift region from said relatively highly doped region of the second conductivity type when the device is in the on-state and providing current conduction in said first direction, the method comprising:
  varying relative voltages applied to the first terminal, the second terminal, the first insulated gate and the second insulated gate so as to switch the device between
  (i) blocking current conduction in both of said directions,
  (ii) providing an insulated-gate bipolar transistor (IGBT) mode of conduction in said first direction and
  (iii) providing an anti-parallel diode mode of conduction in a second direction.

* * * * *